United States Patent [19]
Markis

[11] Patent Number: 5,598,040
[45] Date of Patent: Jan. 28, 1997

[54] LASER WRITER HAVING HIGH SPEED HIGH CURRENT LASER DRIVER

[75] Inventor: William R. Markis, Rochester, N.Y.

[73] Assignee: Eastman Kodak Company, Rochester, N.Y.

[21] Appl. No.: 455,963

[22] Filed: May 31, 1995

[51] Int. Cl.⁶ .................................................... H02J 3/14
[52] U.S. Cl. .................... 307/38; 307/11; 372/9; 372/26; 372/38; 372/50
[58] Field of Search .................... 307/38, 11; 372/38, 372/50, 26, 9

[56] References Cited

U.S. PATENT DOCUMENTS

| | | | |
|---|---|---|---|
| 3,388,300 | 6/1968 | Allmark et al. | 317/148.5 |
| 3,446,984 | 5/1969 | Shukla | 307/88 |
| 3,700,985 | 10/1972 | Applequist | 317/148.5 R |
| 3,930,171 | 12/1975 | Takahashi | 307/270 |
| 4,743,091 | 5/1988 | Gelbart | 350/252 |
| 4,819,242 | 4/1989 | Kaku et al. | 372/38 |
| 5,109,460 | 4/1992 | Baek et al. | 385/115 |
| 5,132,553 | 7/1992 | Siegel | 307/270 |
| 5,260,956 | 10/1993 | Inaba et al. | 372/38 |
| 5,315,606 | 5/1994 | Tanaka | 372/38 |
| 5,333,081 | 7/1994 | Mitsui | 360/46 |
| 5,438,581 | 8/1995 | Reele | 372/38 |
| 5,444,728 | 8/1995 | Thompson | 372/38 |
| 5,488,625 | 1/1996 | Nakamori et al. | 372/50 |

FOREIGN PATENT DOCUMENTS

0678982A2  10/1995  European Pat. Off. ..... H03K 17/567

Primary Examiner—William M. Shoop, Jr.
Assistant Examiner—Albert W. Paladini
Attorney, Agent, or Firm—Milton S. Sales

[57] ABSTRACT

A diode laser writer having a high speed, high current, precision laser driver provides for switching a constant current source between a write laser and a dump load. An inductor is provided in a leg of the circuit such that the inductor and the constant current source form a series circuit with whichever of the dump load and the write laser that is switched ON. The inductor keeps the current constant because the inductor produces an e.m.f. counter to the e.m.f. of the load inductance. The added inductance will generate an e.m.f. counter to that of the load inductance, serving to augment the compliance voltage. The overall effect of the added inductor is to restore the constant current property of the circuit.

4 Claims, 5 Drawing Sheets

LASER WRITER HAVING HIGH SPEED HIGH CURRENT LASER DRIVER

BACKGROUND OF THE INVENTION

1. Technical Field

This invention relates generally to techniques for efficiently using laser diodes in laser writers such as printers and recorders, and more particularly to precision laser drivers for such printers.

2. Background Art

In laser writers such as laser thermal printers and recorders, the optical power of lasers is used to affect a transfer of a dye or ink from a donor medium to a receiver member. High power is needed to enhance the writing speed of lasers. One technique for achieving high power in a laser thermal printer is to use a number of independently modulated diode lasers. U.S. Pat. No. 5,109,460, which issued to Baek et al. on Apr. 28, 1992, discloses an optical fiber print head system in which a plurality of independently-modulated diode lasers are each coupled to one end of a respective optical fiber. The other end of each of the optical fibers is placed in a grooved mount such that the fiber ends form a line of closely spaced elements forming a monolithic optical fiber head. The optical fiber head is imaged onto a thermal dye media as an array of closely spaced laser light spots.

U.S. Pat. No. 4,743,091, which issued to Gelbart on May 10, 1988, discloses an optical data storage apparatus in which numerous independently-modulated diode lasers are arranged as a closely packed, two dimensional array. The array is imaged onto a moving optical recording medium.

Precision laser drivers, such as drivers that maintain better than 0.5% current regulation, should be able to have the current which is commanded to a write laser remain at the commanded value regardless of time, temperature, etc. There are a number of known ways to produce such precision laser drivers; such as the so-called "balanced" system. In a balanced system, D.C. current from a constant current source is shuttled between the write laser and an associated "dummy" or dump laser. In the prior art, this process is used to keep the heat of the laser constant. In one known application, ten write lasers and ten associated dump lasers are used, so the current is shuttled between selected ones of the write laser to turn them ON or to the associated dump laser to turn the write laser OFF.

If the line from the current source to the laser is shorter than the quarter wavelength of the highest frequency, the line will appear as an unmatched load inductance for the whole range of frequencies used. The load inductance can produce a counter e.m.f. opposing the rise of current needed to shuttle the constant current source back and forth between the dump laser and the write laser.

In the case of low power lasers, merely matching the impedance of the load to the impedance of the line would effectively eliminate the effect on the load inductance. However, without using resistors, it is very difficult to get a broad band match; while the use of resistors results in power lost to heat. Thus, it is impractical to try to match the load to the line when using high power lasers.

DISCLOSURE OF THE INVENTION

Accordingly, it is an object of the present invention to provide a laser writer having a high speed, high current, precision laser driver.

It is another object of the present invention to provide a diode laser array writer having high speed, high current, precision laser drivers.

According to one feature of the present invention, this object is accomplished by switching a constant current source between a write laser and a dump load, and by providing an inductor in a leg of the circuit such that the inductor and the constant current source form a series circuit with whichever of the dump load and the write laser that is switched ON. The inductor keeps the current constant because the inductor produces an e.m.f. counter to the e.m.f. of the load inductance.

The addition of an inductor between the constant current source and the switched load solves the above-noted problem of charging the load inductance. Since the current through this part of the circuit should not change, an inductor there will have no harmful effect, and it will maintain the current flow at a steady level. The added inductance will generate an e.m.f. counter to that of the load inductance, serving to augment the compliance voltage. The overall effect of the added inductor is to restore the constant current property of the circuit.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which:

FIG. 2b is a plot of the current through a part of the circuit of FIG. 2a;

FIG. 2c is a plot of the voltage across a part of the circuit of FIG. 2a;

FIG. 3b is a plot of the current through a part of the circuit of FIG. 3a;

FIG. 3c is a plot of the voltage across a part of the circuit of FIG. 3a;

FIG. 4b is a plot of the current through a part of the circuit of FIG. 4a;

FIG. 4c is a plot of the voltage across a part of the circuit of FIG. 4a;

FIG. 5b is a plot of the current through a part of the circuit of FIG. 4a;

FIG. 5c is a plot of the voltage across a part of the circuit of FIG. 4a; and

FIG. 6 is a more detailed circuit diagram of the preferred embodiment of the present invention shown in FIG. 5a.

BEST MODE FOR CARRYING OUT THE INVENTION

The present description will be directed in particular to elements forming part of, or cooperating more directly with, apparatus in accordance with the present invention. It is to be understood that elements not specifically shown or described may take various forms well known to those skilled in the art.

Figure 1:
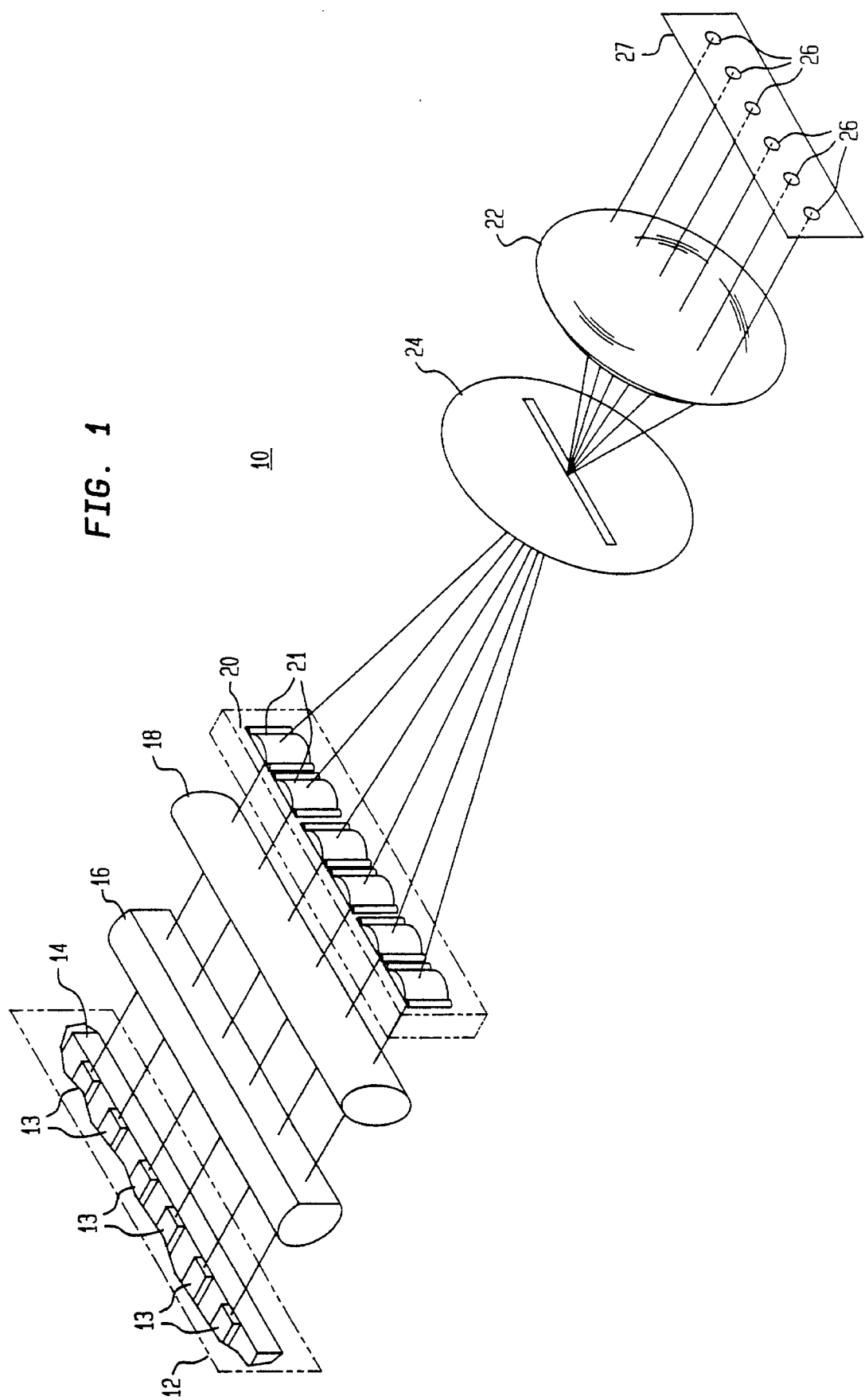
FIG. 1 is a perspective view of an optical arrangement for use with a laser diode array in a laser thermal printer or recorder in accordance with the present invention.

As shown in FIG. 1, an optical arrangement 10 for a laser thermal printer with a multi-mode laser diode array 12 comprises a plurality of independently-modulated laser diode sources 13 formed on a substrate 14. Laser light is focused by a first cylinder lens 16 having a high numerical aperture, a second cylinder lens 18 having a low numerical aperture, a micro lenslet array 20, and a printing lens 22. Further details of the system illustrated in FIG. 1 can be found in commonly assigned, co-pending U.S. patent application Ser. No. 07/986,207, filed in the name of D. Kessler on Dec. 7, 1992, the disclosure of which is specifically incorporated into this specification by reference.

Figure 2A:
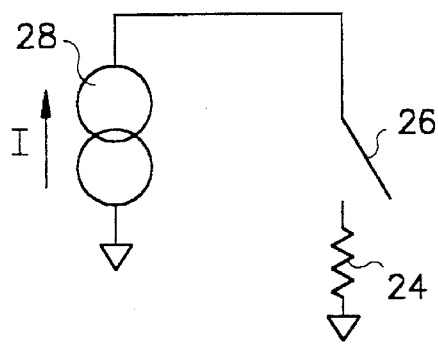
FIG. 2a illustrates an "ideal" circuit that has no inductance in the load resistance.
Figure 2B:
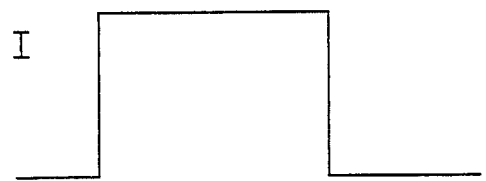
Figure 2C:
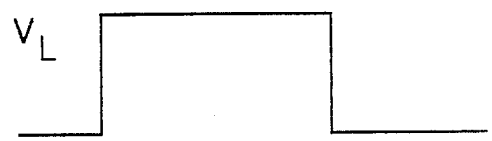

FIG. 2a illustrates an "ideal" circuit that has no inductance in a load resistance 24. Upon closing a switch 26, the current "I" from a constant current source 28 through the load is illustrated in FIG. 2b, while FIG. 2c illustrates the voltage $V_L$ across load 24. $V_L$ is assumed to be $IR_L$, and is less than the maximum compliance voltage of constant current source 28.

Figure 3A:
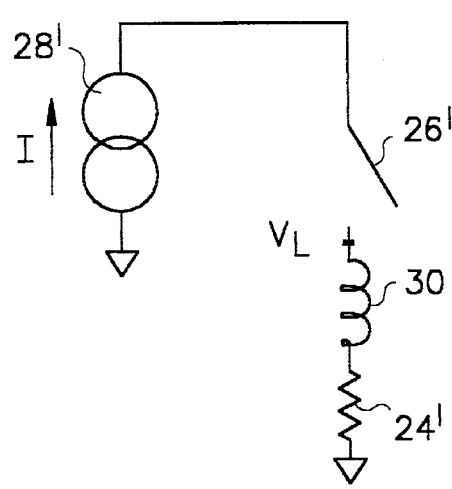
FIG. 3a illustrates a circuit that has inductance in the load resistance.

However, if a current is forced into an inductor 30 by a current source, as illustrated in FIG. 3a, the inductor will produce a counter e.m.f., or "back voltage," in the direction which will inhibit any change in current and will have the magnitude:

$$V = L^{di}/_{dt},$$

where "L" is the inductance value of inductor 30.

Figure 3B:
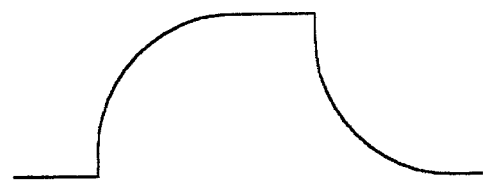
Figure 3C:
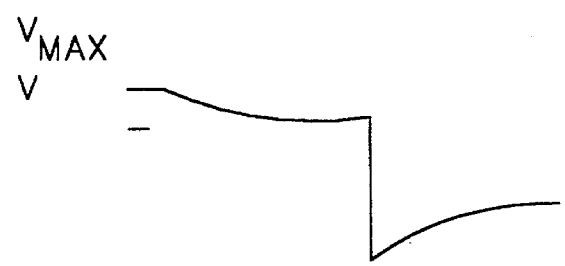

This property becomes a substantial problem when a fairly large current is forced rapidly through even a modest inductance. Once the compliance range (the range of impedances in which a constant current source can function as such) of the current source is exceeded, the current source ceases to operate until the inductance becomes charged. FIG. 3b illustrates the current "I" through the circuit of FIG. 3a, while FIG. 3c illustrates the voltage $V_L$ across the resistive and inductive load. Here, $V_L$ has a $L^{di}/_{dt}$ component which takes the current source to it's compliance limit so that it is no longer an effective current source.

Figure 4B:
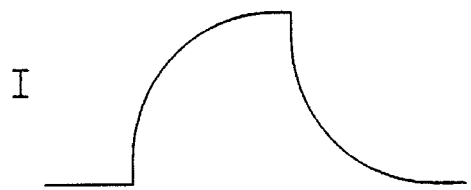
Figure 4A:
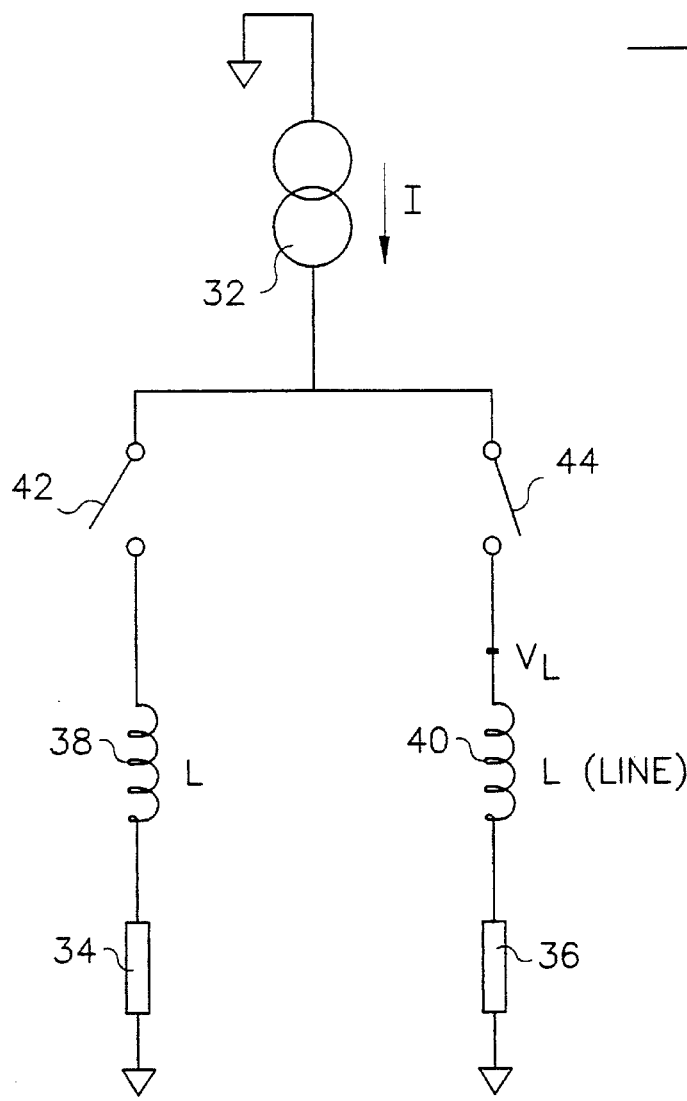
FIG. 4a is a schematic illustration of a laser driver for high speed, high power laser diode arrays in laser printers and recorders showing the problem overcome by the present invention.

Referring now to FIG. 4a, a laser driver for high speed, high power laser diode arrays in laser printers and recorders includes a constant current source 32 and a pair of laser loads 34 and 36. Load 34 may represent a write laser and load 36 may represent a dump laser. Note that line inductance's 38 and 40 have been illustrated in the circuit. A pair of switches 42 and 44 operate together in opposite states to shuttle the current from source 32 between load 34 and load 36.

Figure 4C:
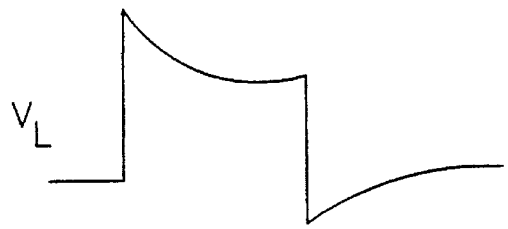

As illustrated, switch 44 is closed, providing a constant current through dump laser 34. Line inductance 40 produces no e.m.f. Now, when switch 44 is opened and switch 42 is simultaneously closed to shuttle the current from dump laser 36 to write laser 34, line inductance 38 produces an e.m.f. opposing the current change, as illustrated in FIG. 4b. FIG. 4c illustrates the voltage across the load.

Figure 5B:
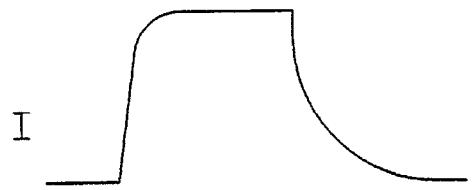
Figure 5A:
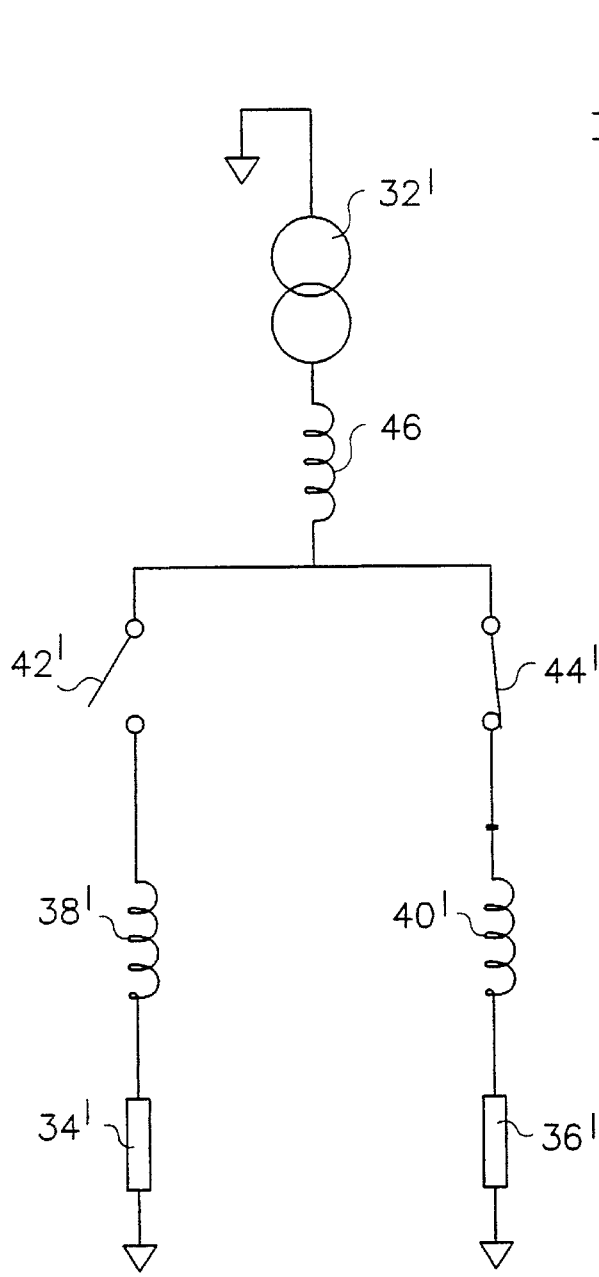
FIG. 5a is a schematic illustration of a laser driver for high speed, high power laser diode arrays in laser printers and recorders showing a preferred embodiment of the present invention.

In FIG. 5a, a laser driver for high speed, high power laser diode arrays in laser printers and recorders includes a constant current source 32' and a pair of laser loads 34' and 36'. As in FIG. 4a, load 34' may represent a write laser and load 36' may represent a dump laser. Note that line inductance's 38' and 40' have also been illustrated in the circuit. Again, a pair of switches 42' and 44' operate together in opposite states to shuttle the current from source 32' between load 34' and load 36'. Unlike FIG. 5a, an inductor 46 has been placed in the circuit so as to be between constant current source 32' and the load connected to the constant current source. By placing inductor 46 in a leg of the circuit between the constant current source and the load so that the inductor and the constant current source form a series circuit with which ever of the dump laser and the write laser that is switched ON, the inductor is able to keep the current constant because the inductor produces an e.m.f. counter to the e.m.f. of the load inductance.

The addition of an inductor between the constant current source and the switched load solves the above-noted problem of charging the load inductance. Since the current through this part of the circuit should not change, an inductor there will have no harmful effect, and it will maintain the current flow at a steady level. The added inductance will generate an e.m.f. counter to that of the load inductance, serving to augment the compliance voltage. The overall effect of the added inductor is to restore the constant current property of the circuit.

Figure 5C:
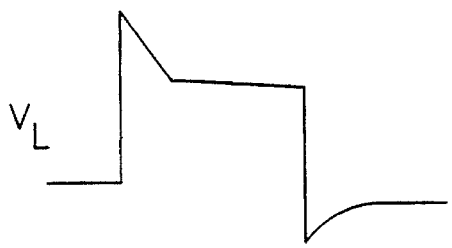

As illustrated, switch 44' is closed, providing a constant current through dump laser 34'. Line inductance 40' produces no e.m.f. Now, when switch 44' is opened and switch 42' is simultaneously closed to shuttle the current from dump laser 36' to write laser 34', line inductance 38' produces an e.m.f. opposing the current change, but inductor 46 produces a counter e.m.f. to tend to offset the e.m.f. of the line inductance; producing a current as illustrated in FIG. 5b. FIG. 5c illustrates the voltage across the load.

Figure 6:
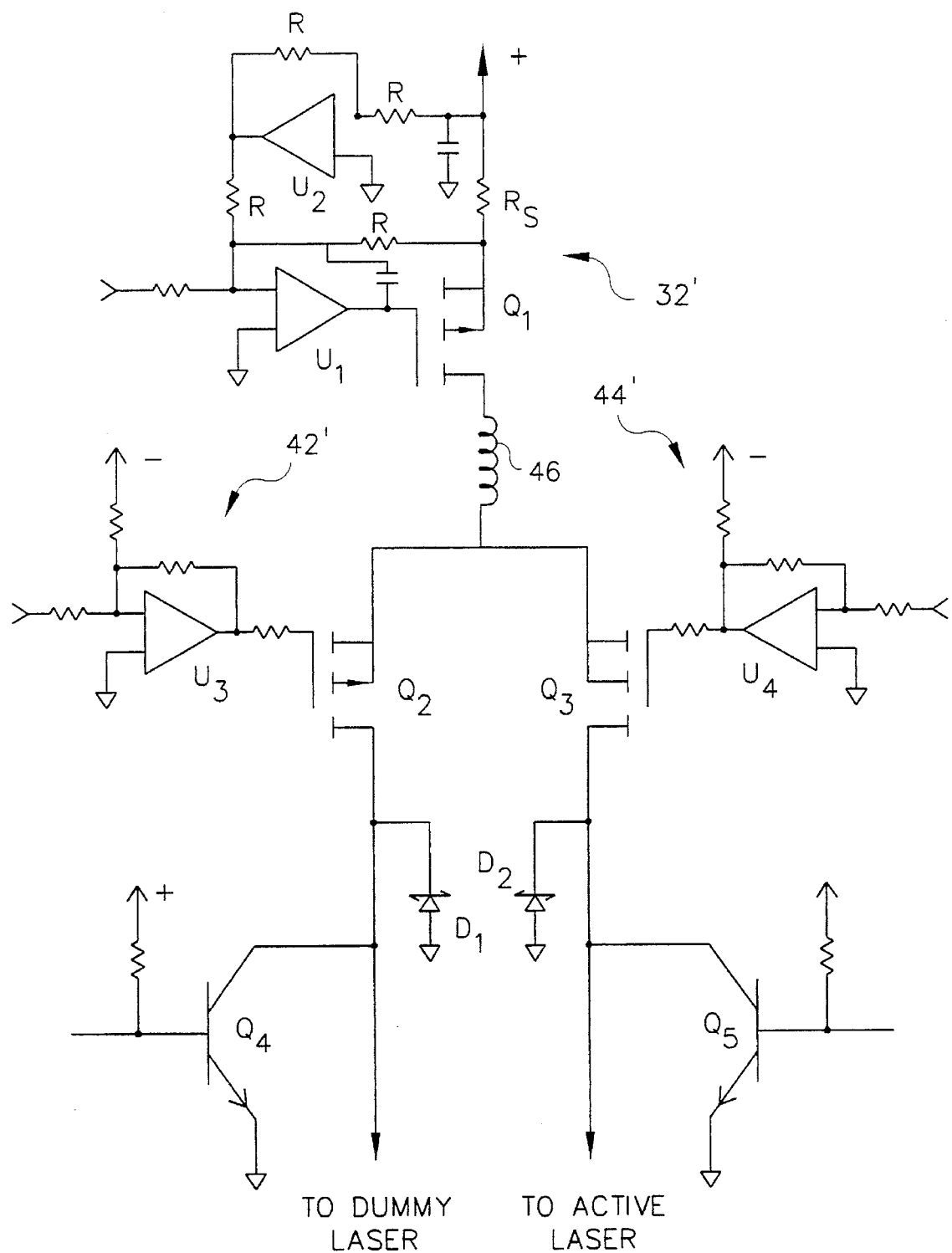

FIG. 6 depicts a preferred specific embodiment of a laser driver according to the present invention. P-channel enhancement-type MOS-FET $Q_1$, operational amplifier $U_1$, operational amplifier $U_2$, their associated components form constant current source 32' of FIG. 5a. Operational amplifier $U_1$ receives a current level command from an outside source, not shown, and establishes a voltage across a sense resistor $R_S$. This, in turn, establishes a current through $R_S$. Since FET $Q_1$ is inside the loop of operational amplifier U1, the gain of the operational amplifier will cancel any effects that FET $Q_1$ may generate. Operational amplifier $U_2$ and its associated components form a unity gain power supply rejection circuit. Any power supply voltage change is reflected to both sides of $R_S$. Thus, for a change in power supply voltage there is no change of current.

The afore mentioned "added inductor" 46 is connected to the drain of FET $Q_1$. As previously stated, its purpose is to keep the current at a constant value during switching transients. The other side of inductor 46 is connected to both sources of a differential FET switch $Q_2$, $Q_3$ which forms switches 42' and 44' of FIG. 5a. These devices are switched by their gate drive operational amplifiers $U_3$ and $U_4$, respectively. The operational amplifiers convert a TTL signal into levels suitable for driving the gates. Since the signals to operational amplifiers $U_3$ and $U_4$ are complementary, FETs $Q_2$ and $Q_3$ are turned ON and OFF at opposite times.

The circuit is completed by the addition of Schottky diodes $D_1$ and $D_2$ and a pair of "crowbar" devices $Q_4$ and $Q_5$. Schottky diodes $D_1$ and $D_2$ perform a dual function: they protect the laser devices from any reverse transients, and they provide a discharge path for the load inductance. The crowbar devices protect the lasers from forward transients, as well as act as personnel safety features; as they shunt all of the current in both the active laser and the dummy laser to ground unless commanded otherwise.

The invention has been described in detail with particular reference to preferred embodiments thereof, but it will be understood that variations and modifications can be effected within the spirit and scope of the invention.

What is claimed is:

1. A laser writer having a laser driver including:

at least one write laser;

a dump load associated with said at least one write laser;

a constant current source;

switch means for alternatively connecting the constant current source to the at least one write laser and to the dump load associated with the at least one write laser; and an inductor positioned so as to be connected
- between the constant current source and the at least one write laser when the at least one write laser is connected to the constant current source by the switch means, and
- between the constant current source and the dump load when the dump load is connected to the constant current source by the switch means.

2. A laser writer as set forth in claim 1 wherein the dump load is a dummy laser.

3. A laser writer having a laser driver including:

a plurality of independently-modulated diode lasers;

a dump load associated with each of said plurality of write lasers;

a constant current source;

switch means for alternatively connecting the constant current source to the plurality of write lasers and to the dump load associated with the plurality of write lasers; and an inductor positioned so as to be connected
- between the constant current source and the plurality of write lasers when the plurality of write lasers is connected to the constant current source by the switch means, and
- between the constant current source and the dump load when the dump load is connected to the constant current source by the switch means.

4. A laser writer as set forth in claim 1 wherein the switch means comprises a pair of switches operable together in opposite states to shuttle current from the constant current source between the at least on write laser and the dump load.

* * * * *